United States Patent [19]

Ayata et al.

[11] Patent Number: 4,794,648
[45] Date of Patent: Dec. 27, 1988

[54] MASK ALIGNER WITH A WAFER POSITION DETECTING DEVICE

[75] Inventors: Naoki Ayata, Machida; Yasuyoshi Yamada, Tokyo, both of Japan

[73] Assignee: Canon Kabushiki Kaisha, Tokyo, Japan

[21] Appl. No.: 42,534

[22] Filed: Apr. 27, 1987

Related U.S. Application Data

[63] Continuation of Ser. No. 543,872, Oct. 20, 1983, abandoned.

[30] Foreign Application Priority Data

| Oct. 25, 1982 | [JP] | Japan | 57-187243 |
| Nov. 30, 1982 | [JP] | Japan | 57-210921 |
| Nov. 30, 1982 | [JP] | Japan | 57-210922 |
| Nov. 30, 1982 | [JP] | Japan | 57-210923 |
| Nov. 30, 1982 | [JP] | Japan | 57-210924 |
| Nov. 30, 1982 | [JP] | Japan | 57-210925 |
| Nov. 30, 1982 | [JP] | Japan | 57-210926 |
| Nov. 30, 1982 | [JP] | Japan | 57-210927 |
| Nov. 30, 1982 | [JP] | Japan | 57-210928 |

[51] Int. Cl.$^4$ ............................................. G06K 9/00
[52] U.S. Cl. ...................................... 382/8; 356/401; 358/101
[58] Field of Search ................. 382/8, 48; 358/101, 358/106, 107; 356/399, 400, 401, 392

[56] References Cited

U.S. PATENT DOCUMENTS

| 4,103,998 | 8/1978 | Nakazawa et al. | 356/399 |
| 4,203,132 | 5/1980 | Schmitt et al. | 358/101 |
| 4,251,129 | 2/1981 | Suzki et al. | 356/401 |
| 4,275,306 | 6/1981 | Kato et al. | 356/401 |
| 4,353,087 | 10/1982 | Berry et al. | 358/101 |
| 4,475,122 | 10/1984 | Green | 382/8 |
| 4,504,148 | 3/1985 | Kuroki et al. | 356/400 |
| 4,521,082 | 6/1985 | Suzoki et al. | 356/400 |
| 4,545,684 | 10/1985 | Kuroki et al. | 356/400 |
| 4,553,845 | 11/1985 | Kuroki et al. | 356/401 |
| 4,563,094 | 1/1986 | Yamada | 356/400 |
| 4,595,289 | 6/1986 | Feldman et al. | 356/392 |

*Primary Examiner*—Leo H. Boudreau
*Assistant Examiner*—Joseph Mancuso
*Attorney, Agent, or Firm*—Fitzpatrick, Cella, Harper & Scinto

[57] ABSTRACT

A mask aligner includes a TV image pick-up device having a wide field angle and picking up the image of a wafer detection pattern on an image pick-up station to generate TV signals at the output, a fine alignment device for detecting a positional deviation of the wafer relative to a mask in an exposure station with the detected result being used to align the wafer with the mask, a transport stage for carrying and transporting the wafer from the image pick-up station to the exposure station, a processing device for determining the positional deviation of the wafer relative to the reference position on the image pick-up stage in accordance with the TV signals, and a drive for moving the transport stage so as to remove the positional deviation of the wafer relative to the reference position of the exposure station.

6 Claims, 10 Drawing Sheets

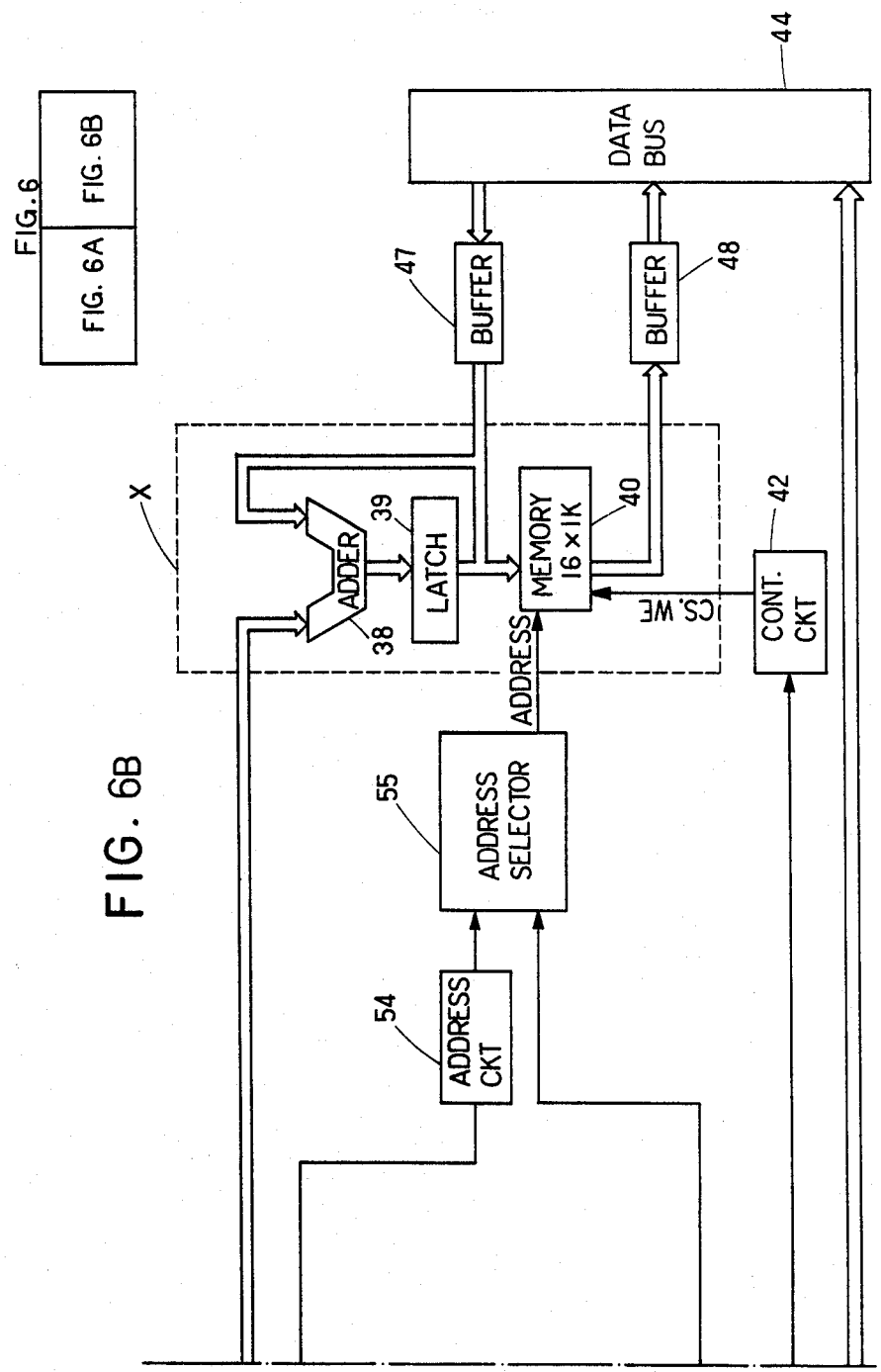

MASK ALIGNER WITH A WAFER POSITION DETECTING DEVICE

This application is a continuation of application Ser. No. 543,872, filed Oct. 20, 1983, now abandoned.

BACKGROUND OF THE INVENTION

1. Field of the Invention

The present invention relates to a mask aligner with a wafer position detecting device, such as a video image pick-up device, for use in a semiconductor circuit manufacturing system. In general, the semiconductor circuit manufacturing process utilizes an automatic positioning device for aligning a wafer with a mask with high accuracy when the wafer is exposed to the pattern of a semiconductor integrated circuit on a photo-mask or reticle (hereinafter both called "mask" (for both).

2. Description of the Prior Art

In the prior art, when a wafer is to be automatically aligned with a mask in the semiconductor exposing device, the outer shape of the wafer, for example, the outer shape of a circular plate partially cut is mechanically utilized to preliminarily align the wafer with the mask as is known by U.S. Pat. No. 3,982,627. This is called "pre-alignment". An optical pre-alignment also is known as described in IBM Technical Disclosure Bulletin, Vol. 14, No. 11, April 1972, pp. 3239–3242. After the pre-alignment, the wafer is moved to an exposure station by means of a moving arm. At the exposure station, the respective alignment marks on the mask and wafer are photoelectrically sensed to generate signals, in accordance with which one of the mask or wafer is moved in an orthogonal direction and rotated.

Methods for photoelectrically detecting the alignment marks include a method in which the alignment marks on the mask and wafer are optically and one-dimensionally scanned by, for example, a laser beam, and the light reflected by the alignment marks is received by a photocell, a method in which the alignment marks are detected by a TV camera to generate video signals which are in turn processed electrically to know the relative position of the alignment marks, and so on.

Upon setting the position in the pre-alignment, which is mechanical, the accuracy is at most on the order of $\pm 100$ $\mu$m. This relatively low accuracy should be compensated with a photoelectric detector having its wide field of view which is above several hundreds of microns. As the field of view is wider on detection, however, time required to detect signals is extended. This is particularly so, since a plurality of scanning operations must be done. Furthermore, the wider field of view involves difficulties in that the accuracy of detection is limited when an optical system of wide field of view cannot easily be improved in performance, and so on. If the positional deviation between the wafer and the mask is increased at the initial condition, time required to automatically align the wafer with the mask is remarkably extended. On the other hand, a typical exposing apparatus, particularly of such a type that a circuit pattern on the mask is projected on the wafer through a projection optical system, utilizes a TTL system for detecting the alignment marks through the projection optical system, or an Off-Axis method in which the wafer is precisely positioned at a position out of the projection field (a region on which an image is projected) of the projection optical system and then moved to the projection field with high accuracy to align the wafer with the mask which has properly been set in the projection field. However, the former has a problem associated with the wider field of view afore-mentioned while the latter requires a very expensive gauge interferometer and precise transport mechanism for moving the wafer with high accuracy.

SUMMARY OF THE INVENTION

It is an object of the present invention to accomplish fine alignment at higher speed and with higher accuracy.

The second object of the present invention is to reduce the field of detection in an optical system for fine alignment.

The third object of the present invention is to increase the field of detection by the use of a two dimensional image pick-up device as the wafer is coarsely positioned prior to the fine alignment.

Another object is to compensate for errors in the X and Y directions as well as errors in rotation when the wafer is positioned prior to the fine alignment.

Another object is to selectively compensate only for the errors in the X and Y direction or the errors in rotation in addition to the compensation in the X and Y directions depending on the required time and accuracy for fine alignment when the wafer is positioned prior to the fine alignment.

Another object is to indicate a predetermined mark on an indicator connected with a two dimensional image pick-up device such as video camera for visually providing any detected result.

Another object is to provide an illumination device for illuminating the wafer when the image thereof is picked up by a two dimensional image pick-up device, the illumination device being capable of selectively operating in either of the dark field illumination mode or the light field illumination mode.

Still another object is to provide an apparatus in which a wafer is first positioned by mechanical pre-alignment out of the projection field of a projection optical system, a two dimensional alignment mark on the wafer being then picked up by two dimensional image pick-up means such as TV camera having its relatively wide field of view to form video signals which are in turn used to detect any positional deviation of the wafer relative to the reference position (TV pre-alignment) with the detected deviation being considered when the wafer is moved to the projection field, whereafter another alignment mark is scanned by a laser beam having its relatively narrow field of view to obtain alignment signals which are used to precisely align the mask with the wafer (fine alignment).

BRIEF DESCRIPTION OF THE DRAWINGS

FIG. 6 shows how FIGS. 6A and 6B are assembled to form a block diagram showing an example of TV pre-alignment detection circuits;

DESCRIPTION OF THE PREFERRED EMBODIMENTS

Figure 1:
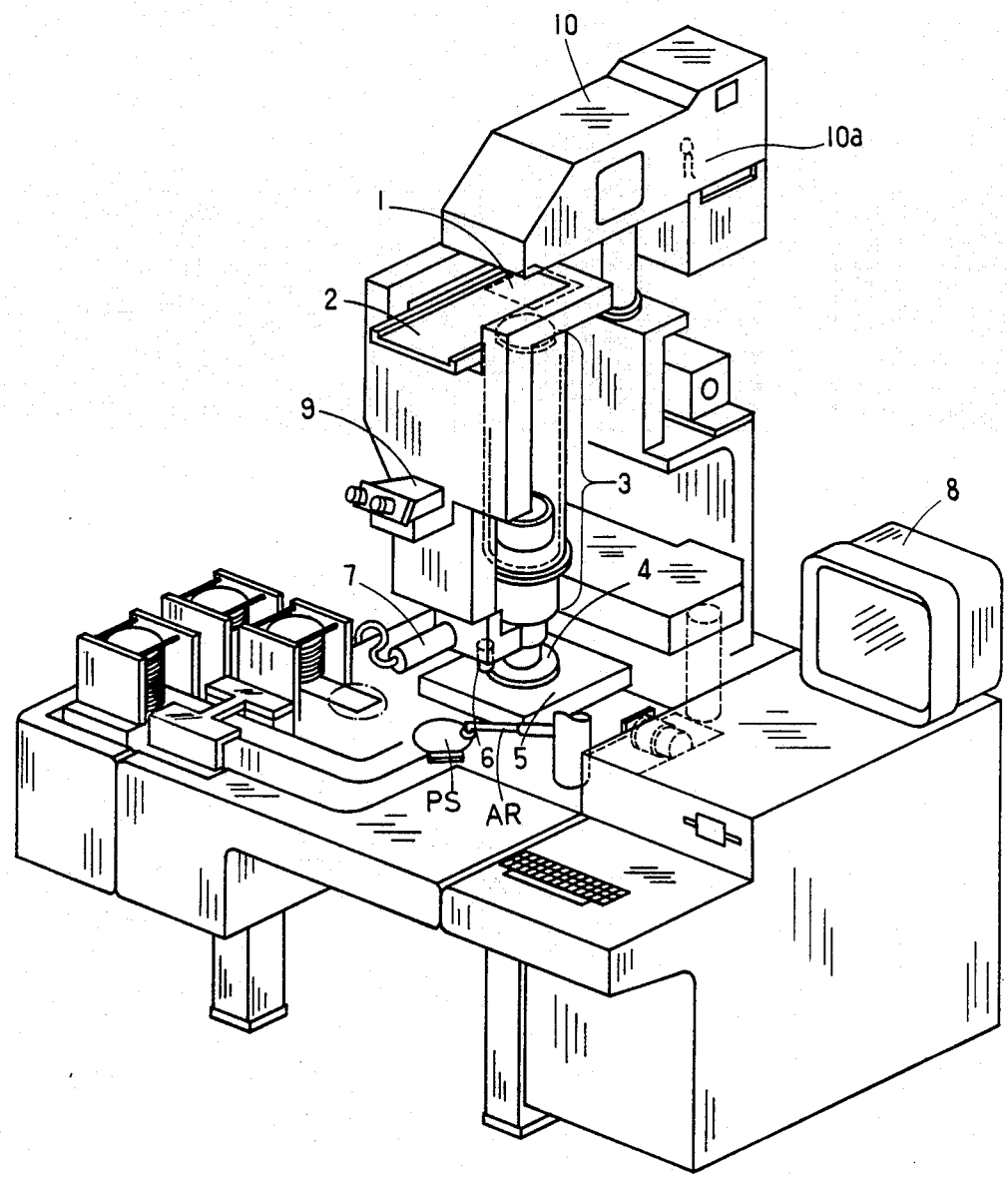
FIG. 1 is a perspective view showing the external appearance of one embodiment according to the present invention.

First of all, the general construction will be described with reference to FIG. 1 which shows the external appearance thereof.

Numeral 1 denotes a mask having an integrated circuit pattern, a mask setting mark and a fine alignment mark. The device includes a mask 2 chuck for holding and moving the mask 1a in plane and with rotational motion; a reduction projection lens 3; a wafer 4 having a photosensitive layer, a fine alignment mark and a pre-alignment mark; and a wafer stage 5 including a chuck (not shown). The wafer stage 5 serves to hold and move the wafer 4 in plane and with rotational motion. The wafer stage 5 moves between a wafer exposure position (within the projection field) and a TV pre-alignment position. The device further includes an objective lens 6 in a TV pre-alignment detection device; an image pick-up tube or solid state image pick-up element 7; a TV receiver 8 for observing images; a binocular unit 9 for observing the surface of the wafer 4 through the projection lens 3; and an upper unit 10 containing an illumination optical system for converging a mask illuminating light from a source of light 10a and the fine alignment detection device. The aligning device is equipped with a stage PS of a mechanical pre-alignment device which is adapted to position the wafer by forcing the flat edge thereof against a reference surface while rotating the wafer.

The wafer stage 5 holds the wafer transported from the stage PS by means of a wafer transport arm AR in place and then moves to a position at which the alignment mark on the wafer enters the visual field of the objective lens for TV pre-alignment. The positional accuracy depends on the mechanical prealignment accuracy. The visual field of the objective lens 6 is thus in the order of one to two millimeters in diameter. The alignment mark within this visual field is detected by the image pick-up tube 7 to obtain the co-ordinate position thereof relative to a reference mark for TV pre-alignment which is provided within an optical system for TV pre-alignment as will be described hereinafter. The auto-alignment detection position of the projection optical system and the position of the TV pre-alignment reference mark are preset precisely. The amount of movement of the wafer stage 5 into the auto-alignment position can be determined in accordance with the positional relationship between the preset positions and also the detected co-ordinate position of the TV pre-alignment mark.

The accuracy of the detected position in TV pre-alignment is $\pm 5\mu$ or less, but it is at most in the order of $\pm 10\mu$ even in consideration of an error which could be produced upon movement of the wafer stage from the TV pre-alignment position to the fine alignment. Accordingly, the fine alignment may be done within the range of about $\pm 10\mu$. This is one-hundredth or less the visual field of the prior art fine alignment process. Therefore, the fine alignment can be made at higher speed in accordance with the present invention.

Figure 2:
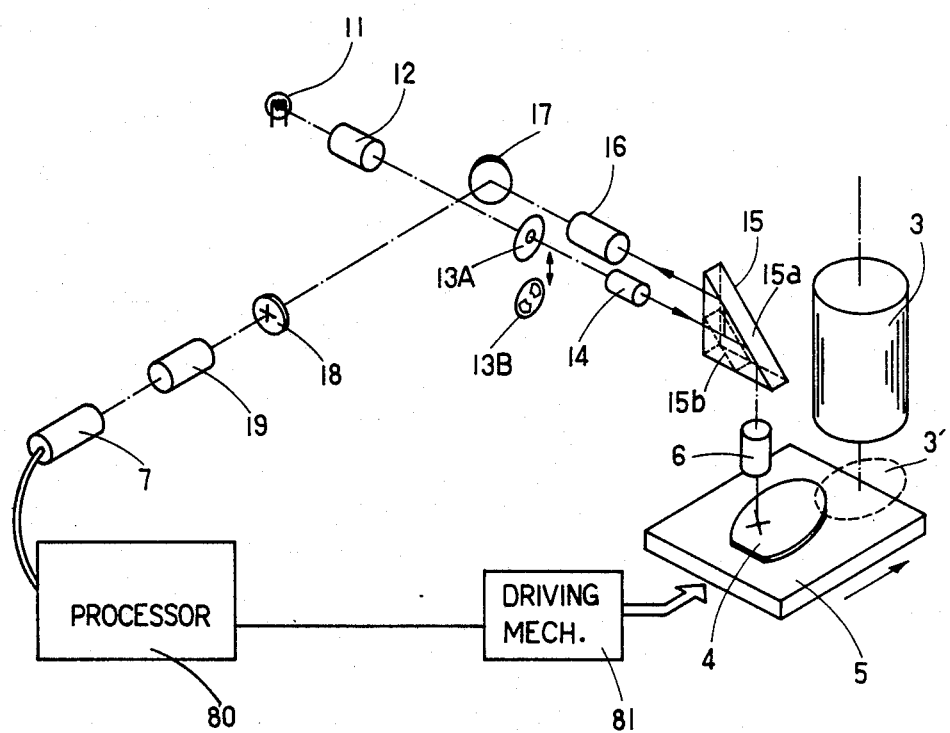
FIG. 2 is an optical perspective view of a TV pre-alignment detection system.

FIG. 2 shows one embodiment of the TV pre-alignment detection device according to the present invention which comprises the same reduction projection lens 3, wafer 4, objective lens 6 and image pick-up tube 7 as in FIG. 1.

In FIG. 2, the TV prealignment detection device includes a source 11 of illumination light such as halogen lamp; a condenser lens 12; a light field stop 13A and dark field stop 13B which are selectively usable in the device, respectively. In FIG. 2, the light field stop 13A is located within the optical path. The condensor lens 12 images the light source 11 on the light field stop 13A. The device includes an illuminating relay lens 14 and a junction prism 15 which functions to bring the optical axis of the illumination system into coaxial relationship with the optical axis of the light receiving system. The junction prism 15 is provided with an inner reflection surface 15a and a semi-transmissive reflection surface 15b. The light source 11, condenser lens 12, light and field stops 13A, 13B, illuminating relay lens 14, junction prism 15 and objective lens 6 define an illuminating system. The light beam from the objective lens 6 illuminates the wafer 4, in such manner that the principal ray emitting at the objective lens 6 is incident perpendicularly on the wafer 4.

The device further includes a relay line 16; a mirror 17 for deflecting the optical path; and a plate glass 18 having a reference mark for TV prealignment which functions as the origin of the co-ordinate axes. Thus, the pre-alignment mark will be detected as values on the co-ordinate axes X and Y. An image pick-up lens 19 defines a light receiving system together with the above-mentioned junction prism 15, relay lens 16, mirror 17, plate glass 18, image pick-up lens 19 and image pick-up tube 7. After being passed through the objective lens 6, the light beam is successively reflected by the inner reflection surface 15a and semi-transmissive reflection surface 15b and again reflected by the inner reflection surface 15a to the relay lens 16. The pre-alignment mark on the wafer 4 is imaged on the plate glass 18 having the reference mark and then on the image pick-up surface of the image pick-up tube 7 together with the reference mark of the plate glass 18.

If the required accuracy is not so severe, two sides of a TV display area or a frame or screen defining this picture may be used as a reference.

Numeral 80 designates a signal processing device which will be described in more detail hereinafter with reference to FIGS. 5 through 9. This signal processing device 80 is adapted to detect the positional deviation of the wafer 4 relative to the reference. Numeral 81 denotes a drive for the wafer 4 which includes two motors for moving the wafer 4 in two directions, X and Y, and a motor for rotating the wafer 4.

The TV pre-alignment mark shown in FIG. 3A or the fine alignment mark described hereinafter is desirably provided in a scribe line on the wafer. Alternatively, it may be located at the position of a specific chip area on the wafer. The illustrated mark is in the form of a cross in the scribe line. The cross has a bar portion substantially parallel to the scanning direction of the image pick-up tube and another bar portion substantially perpendicular to the same scanning direction. If the cross mark is constructed by a plurality of very small bar-like protrusions each of which is inclined with an angle of 45°, for example, relative to the scanning direction and illuminated in the dark field such that these protrusion will be irradiated in the direction perpendicular thereto, a very clear pattern may be picked up.

The reference mark may be a cross pattern made by etching a mask of chrome, for example. Although the position of the cross is not limited, it is desirable that the crossing lines are located adjacent the corner of the visual field in TV and respectively parallel and perpendicular to the scanning direction of the TV.

This reference mark can be detected in the light field with S/N ratio higher than that in the dark field since it is made of a film of chrome so that no light will transmit through it as mentioned above. Thus, the reference mark is first sensed in the light field and the pre-alignment mark is then sensed in the dark field.

Returning to FIG. 2, the detection of the pre-alignment mark will be described except for the step in which the resulting video signals are electrically processed, which will be described hereinafter. The beam of light from the light source 11 is converged by means of the condenser lens 12 and illuminates the opening of the light or dark field stop (13A; 13B) and then passes through the illumination relay lens 14 toward the junction prism 15 wherein the beam transmits through the semi-transmissive surface 15b thereof and is reflected by the reflection surface 15a of the prism 15 to the objective lens 6. After being passed through the objective lens 6, the beam illuminates the wafer 4.

The light beam reflected by the surface of the wafer 4 is imaged on the reflection surface 15a of the junction prism 15 through the objective lens 6. The imaged beam is then reflected by the reflection surface 15a to the semi-transmissive surface 15b whereat the beam is again reflected to the reflection surface 15a. After the beam has been reflected by the reflection surface 15a, it exits the junctions prism and then proceeds to the relay lens 16 through which the beam proceeds to the mirror 17. At this mirror 17, the beam is reflected to image on the plate glass 18 with the resulting image being imaged on the image pick-up tube 7 through the image pick-up lens 19. In such a process, the light field stop 13A has been located in the optical path. Thus, the reference mark on the plate glass 18 is picked up in the light field to obtain the image thereof which is used to determine the origin of the co-ordinate axes. Subsequently, the light field stop 13A is replaced by the dark field stop 13B such that the image of the pre-alignment mark can clearly be observed to detect the position thereof. In response to the position of the prealignment mark image detected by the electrical processing device 80, the wafer stage 5 is moved such that the wafer 4 thereon will be placed at a predetermined position 3' in the projection field of the projection lens 3. The wafer 4 may once be aligned with a standard position and then moved into the projection field.

Subsequently, the mask 1 will finely be aligned with the wafer 4. FIG. 3B exemplifies an alignment mark used in such a fine alignment. In FIG. 3B, symbols W1, W2, W3 and W4 designate the respective bar-like elements carried on the wafer. Two of these bar-like elements W1 and W2 are parallel to each other and inclined by 45° relative to a scan line LA while the other bar-like elements W3 and W4 are similarly parallel to each other but inclined relative to the scan line LA in the opposite orientation by the same angle. Symbols M1 and M2 denote bar-like elements carried on the mask and inclined with the scanning line LA at the same angle but in opposite directions.

In order to obtain three degrees of freedom in the direction X parallel to the scan line, the direction Y perpendicular to the same scan line and the rotational direction, two alignment marks are carried on each of the mask and wafer.

Figure 4:
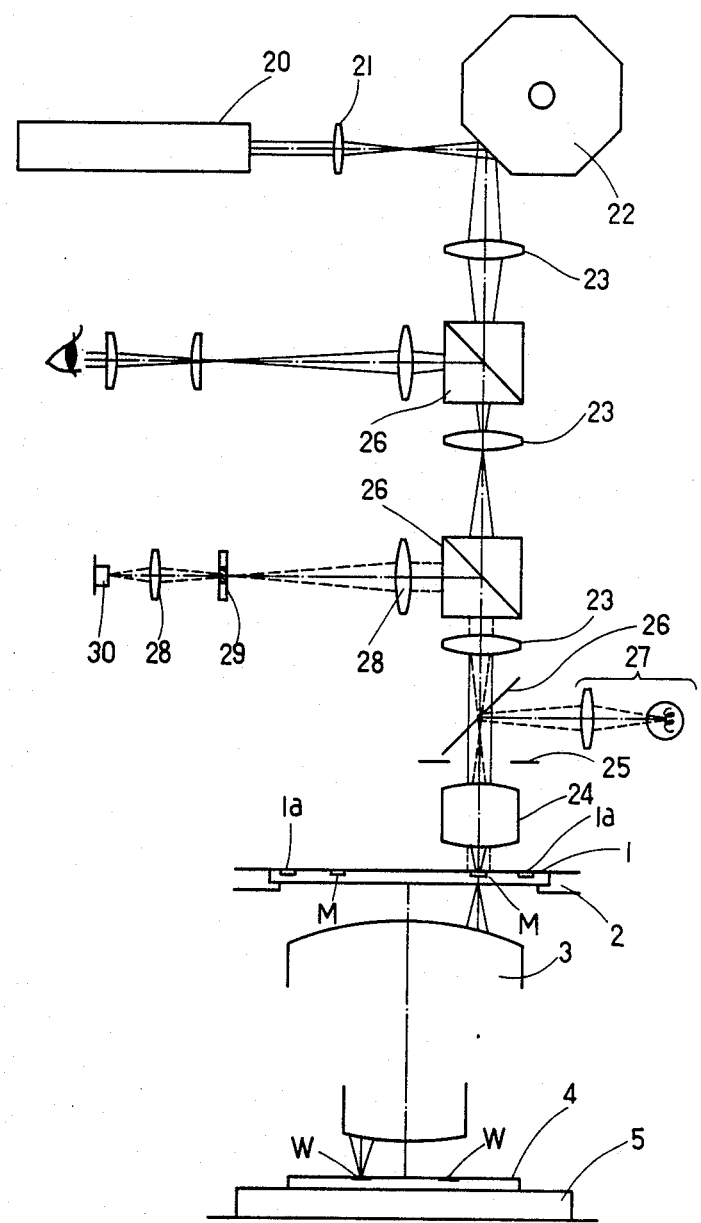
FIG. 4 is an optical cross-section of a fine alignment detection system.

FIG. 4 shows a fine alignment mark detection device which is known, for example as shown, by U.S. Pat. No. 4,251,129. In FIG. 4, the detection device includes a source 20 of a laser beam; a condenser lens 21; a rotating polygonal mirror 22; relay lenses 23; a microscope objective lens 24; a stop 25 disposed at one of the focal planes of the microscope objective lens 24; beam splitters 26; and an observation illuminating section 27. The beam from the observation illuminating section 27 is reflected by the lower beam splitter 26 to converge at the stop 25. The converted beam proceeds through the microscope objective lens 24 to the mask 1 to illuminate it, in the manner that the principal ray emitting at the objective lens 24 is incident perpendicularly on the wafer mask 1.

Numeral 28 designates a condenser lens; 29 a filter for blocking the beam portion specularly reflected by the mask 1 and wafer 4; and 30 a photocell.

In such an arrangement, the laser beam from the source 20 is first converged and then diverged by the condenser lens 21. The diverged laser beam is incident on one mirror face of the rotating polygonal mirror 22 wherein the laser beam is given the scanning action. Subsequently, the laser beam is condensed on the mask through the relay lenses 23, the beam splitters 26 and the microscope objective lens 24 while at same time being condensed on the wafer 4 to scan it, the wafer 4 being conjugate with the mask 1 with respect of the projection lens 3. If the alignment marks are scanned by the laser beam as shown by the scan line LA in FIG. 3B, the laser beam is scattered by the edges of the alignment marks and then is incident on the condenser lens 28 through the microscope objective lens 24, the relay lens 23 and the second beam splitter 26. From the condenser lens 28, the beam proceeds to the filter wherein the component of specularly reflected light is blocked. Subsequently, the beam is incident on the photocell 30 which is turn generates a train of pulses at the output thereof. As seen from FIG. 3B, the relative deviation between the mask 1 and the wafer 4 in the X direction appears as a deviation of the distance between the mark W1 and the mark M1 which is equal to the deviation of the distance between the mark W3 and the mark M2 while the relative deviation therebetween in the Y direction appears as a deviation of the distance between the marks W1 and M1 which is equal to the deviation of the distance between the marks M2 and W4. Values in the X and Y directions are calculated respectively in accordance with pulse intervals which correspond to the respective distances.

Although FIG. 4 shows the system for detecting only one of the alignment marks M or W on the mask 1 or wafer 4, the practical construction is adapted to measure two alignment marks on the mask 1 or wafer 4 simultaneously. Therefore, errors on the mask 1 and wafer 4 with respect to the X and Y directions and the rotational direction can properly be calculated in accordance with values in both the X and Y directions.

In the system shown in FIG. 4, therefore, the mask 1 and wafer 4 can precisely be aligned with each other by moving the mask holder 2 in the X and Y directions and the rotational direction in accordance with the calculated values. Upon termination of this alignment operation, the mask 1 is illuminated by the light source 10a with the circuit pattern thereon being imaged on the wafer 4 through the projection lens 3 at a reduced scale.

If the visual field of the above-mentioned fine alignment detection device is reduced in dimension, the mask 1 should be set in place with increased accuracy. This can be accomplished by using the conventional pre-alignment process such that a setting mark 1a outside the alignment mark will be detected by the fine alignment detection device.

Figure 5:
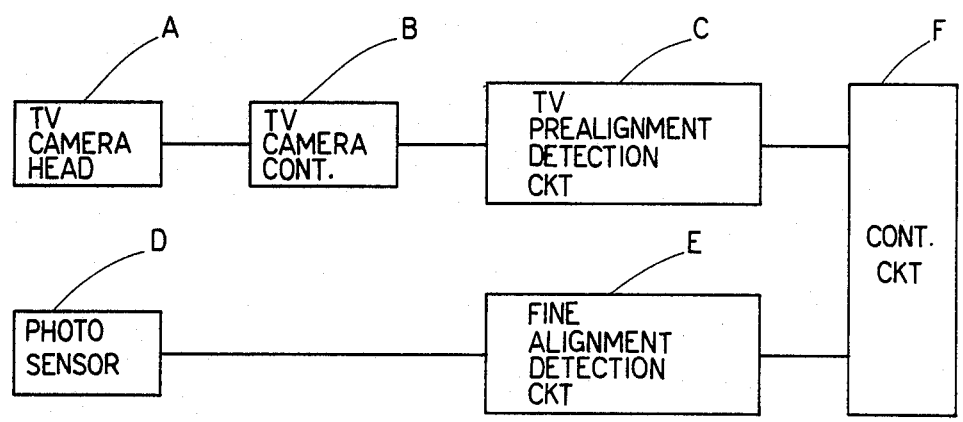
FIG. 5 is an electric block diagram schematically showing a signal processing system.

FIG. 5 schematically shows an electrical signal processing system for TV pre-alignment and fine alignment, which comprises a TV camera head A such as an image pick-up tube, a solid state image pick-up element such as a CCD or the like; a TV camera controlling section B for controlling the TV camera section; a TV pre-alignment detection circuit C; a photosensor section D including photo-transistors, amplifiers and other components; a fine alignment detection circuit E; and a control circuit F including a microcomputer, memories and other components.

The TV pre-alignment detection circuit C generates TV synchronizing signals used to drive the TV camera head A, which signals are transmitted to the TV camera controlling section B. On the other hand, image signals scanned by the TV camera head A are transmitted as video signals to the TV pre-alignment detection circuit C through the TV camera controlling section B. At the TV pre-alignment detection circuit C, these video signals are digitally processed with the resulting data being utilized by the microcomputer in the control circuit F to detect the position of a TV pre-alignment mark as shown in FIG. 3A. In accordance with information on this position, the wafer stage is moved to the automatic fine alignment position in the exposure optical system.

In the automatic fine alignment, a reflective light having such a pattern as shown in FIG. 3B is detected by the photosensor D with the resulting signals being digitized by the automatic fine alignment detection circuit E to measure the spacings in the pattern. Data of the measured spacings is again processed by the microcomputer in the control circuit F to finely align the wafer and mask with each other.

Figure 6A:
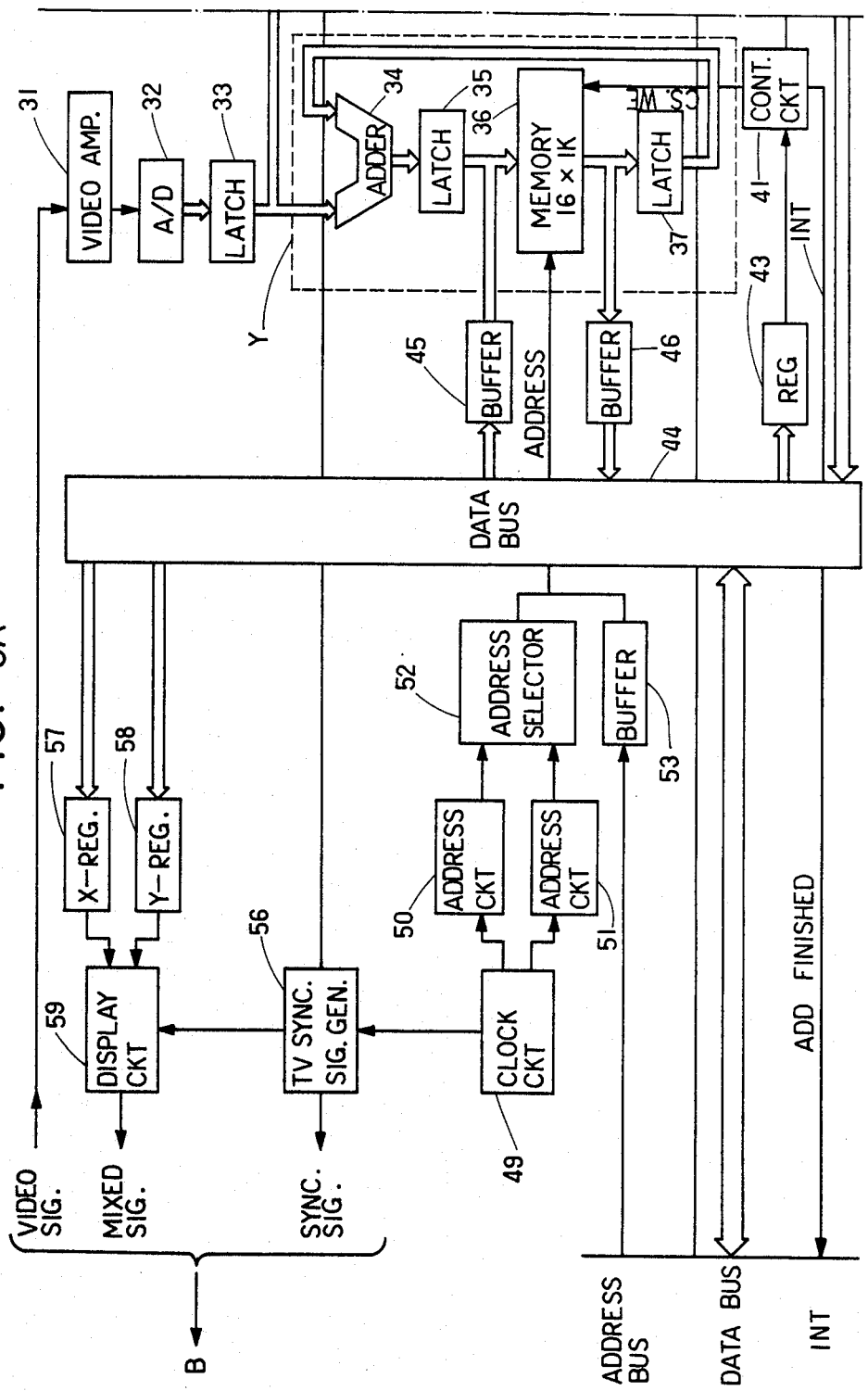

FIGS. 6A and 6B together constitute a block diagram showing one embodiment of the TV pre-alignment detection circuit.

Figure 3A:
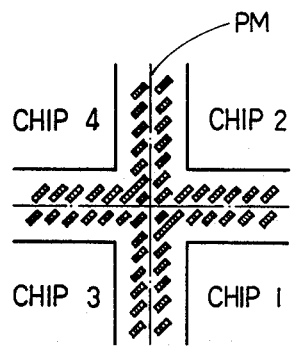
FIG. 3A is a plan view of a TV pre-alignment mark.
Figure 3B:
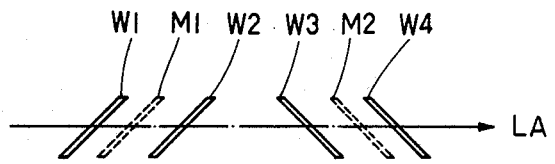
FIG. 3B is a plan view of a fine alignment mark.

Although there are known various methods for detecting the TV pre-alignment marks shown in FIG. 3A, the arrangement of FIGS. 6A and 6B is adapted to resolve a TV picture into picture elements the densities of which are added one to another in the X direction (horizontal) and the Y direction (vertical), respectively.

The addition of the densities of picture elements is advantageous in that random noise is averaged to improve the S/N ratio, in that the detections in the X and Y directions can be carried out independently to simplify them, in that the memory storing the image date has a reduced capacity, and so on.

In the block diagram of FIGS. 6A and 6B, a block X enclosed by broken line is one which adds the densities of the picture elements in the X direction while a block Y is adapted to add the densities of the picture elements in the Y direction.

In FIGS. 6A and 6B, numeral 31 denotes a video amplifier; 32 a analog-to-digial converter; and 33 a latch. Video signals transferred from the TV camera control section (shown by B in FIG. 5) are amplified by the video amplifier 31 and then digitized by the analog-to-digial converter 32 with the digitized data being stored in the latch 33. The output data from the latch 33 is supplied to the addition blocks X and Y. The block Y comprises an adder 34 for adding data in the Y direction, a sum output latch 35 for latching the output data of the adder 34, a Y-direction integrating memory 36 for storing the data from the sum output latch 35, and a sum input latch for latching the output data from the memory 36.

The block X comprises an adder 38 for adding data in the direction X, a latch 39 for latching the output of the adder 38, and a X-direction integrating memory 40 for storing the output data from the latch 39.

Although the number of bits of the digital data in these circuits is not particularly limited, it is preferred that the analog-to-digital converter 32 is of 8-bit capacity and the adders 33, 38, memories 36, 40 are of 16-bit capacity.

A sequence and memory control circuit 41 is for controlling the TV pre-alignment detection circuit in timing and sequence and the memory 36 in read/write and chip-select. A memory control circuit 42 controls the memory 40 in the block X; and a control register 43 causes a microprocessor (not shown) to control the sequence and the memory control circuit 41. The input of the control register 43 is coupled with the data bus 44 of the microprocessor. The microprocessor is also capable of accessing the memories 36 and 37 through the data bus 44 by the use of buffers 45, 46, 47 and 48. The buffers 45 and 47 are actuated when the microprocessor writes data in the memories while the buffers 46 and 48 are activated when the microprocessor reads data. The system includes a clock circuit 49, memory write and read address circuits 50 and 51 for producing write and read addresses in the X-direction integrating memory 36. There are further included an address selector 52 for changing one of the read and write addresses to the other in the memory; an address buffer 53 used when the microprocessor accesses the memory 36, the output of the buffer being inhibited for the period other than access since the output of the address selector 52 is selected; a memory address circuit 54 for addressing the X-direction integrating memory 40; an address selector 55 for selecting one of the address of the memory address circuit 54 and the address produced as the microcomputer accesses the memory 40; a TV synchronizing signal generating circuit 56 for generating horizontal synchronizing signals, vertical synchronizing signals, blanking signals and other signals in the TV in accordance with the clocks from the clock circuit 49; registers 57 and 58 for respectively indicating the positions X and Y, these registers being connected with the data bus 44 of the microcomputer; and a marker indicating circuit 59. When the microprocessor gives the position of the alignment mark detected in the TV pre-alignment process to the X- and Y-position indicating registers 57 and 58, the data is supplied as a mixed signal to the video input terminal of the TV camera controlling section by the marker indicating circuit 59. Thus, a given mark is projected on the TV receiver 8.

The function and operation of the TV pre-alignment detection circuit shown in FIGS. 6A and 6B will now be described.

The TV pre-alignment detection circuit functions to indicate the following results on the TV monitor: (1) integration of data in the X direction; (2) integration of data in the Y direction; and (3) the detected position of the pre-alignment mark.

With respect to the integrations of data in the X and Y directions, the addition is attained by the hardware of the TV pre-alignment detection circuit with the resulting data being stored in the memory. The addition of data may be made per one frame of the TV signals. Alternatively, the addition may be terminated per each frame if desired as will be described or continued until a plurality of frames are added. In any event, the data bus and address bus of the memories 36 and 40 are electrically separated from the data bus 44 and address bus of the microcomputer during the addition step. The address of the memory 36 is connected with the address selector 52 while the address of the memory 40 is coupled with the address of the address circuit 54. The addition step is executed under the control of read/-write signals and chip select signals produced by the hardwares of the sequence and memory control circuit 41 and memory control circuit 42.

After a predetermined number of frames have been added, the sequence and memory control circuit 41 generates an addition finish signal on an interrupt signal line INT. Thereafter, the microprocessor accesses the memories 36 and 40 to sense the position of the TV pre-alignment mark from the data which has been obtained in the addition. When the microcomputer accesses the memories 36 and 40, the addresses of the memories, read/write signals, chip select signals and other signals are necessarily generated under the action of control signals from the microcomputer. Data in the memory 36 is supplied to the data bus 44 through the buffer 46 while data in the memory 40 is transferred to the data bus 44 through the buffer 48. All the data is read by the microcomputer.

Prior to the description of the addition in the blocks X and Y, a process for resolving picture elements will be described with reference to FIG. 7.

Figure 7:
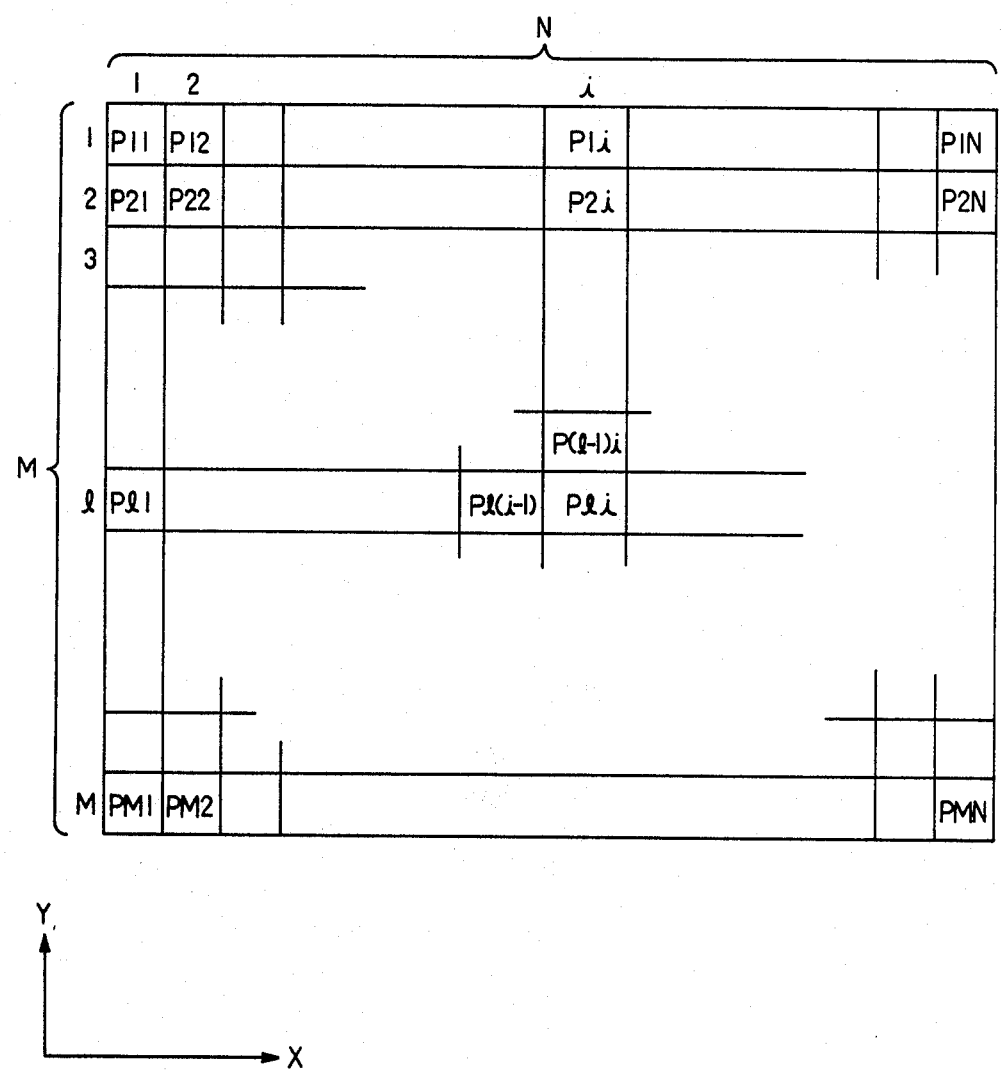
FIG. 7 illustrates a process for dividing picture elements in a TV picture.

FIG. 7 represents a TV picture by the use of picture elements which are respectively resolved by the number N in the X direction and by the number M in the Y direction. A picture element Pli is one which is located at the intersection of line l with column i. The number M of the resolved picture elements in the Y direction normally corresponds to the number of horizontal scan lines. Accordingly, the picture elements may be resolved by effecting samplings of N in number within the duration of one horizontal synchronizing signal by the analog-to-digital converter as shown by 32 in FIG. 6A.

Thus, the addition in the direction is represented by:

---
SX1 = DATA(P11) + DATA(P12) + ... + DATA(P1N),
SX2 = DATA(P21) + DATA(P22) + ... + DATA(P2N),
SXM = DATA(PM1) + DATA(PM2) + ... + DATA(PMN).
---

The addition in the Y direction is represented by:

---
SY1 = DATA(P11) + DATA(P21) + ... + DATA(PM1),
SY2 = DATA(P12) + DATA(P22) + ... + DATA(PM2),
SYN = DATA(P1N) + DATA(P2N) + ... + DATA(PMN).
---

As these additions are terminated, data of SX1, SX2, ... SXM is stored in the X-direction integrating memory 40 while data of SY1, SY2, ... SYN is stored in the Y-direction integrating memory 36. If the scanning the TV utilizes of line sequential system rather than interlacing system, the output data from the analog-to-digital converter 32 is in the following sequence: DATA(P11), DATA(P12), ..., DATA(P1N), DATA(P21), ..., DATA(PMN).

Thus, the addition in the X direction may be continued over one scan line with the result thereof being stored in the memory. On the contrary, the addition in the Y direction must be made by reading data out of the memory for each picture element with each result thereof being stored in the just read address.

The number N of picture elements resolved in the horizontal direction depends on the required accuracy in alignment and is normally equal to about 500. Thus, the rate of sampling per one picture element is 100 nanoseconds or less. In the addition of the Y direction, therefore, the analog-to-digital conversion, read/write from and to the memory and addition must be carried out within 100 nanoseconds. This cannot simply be realized since a huge load is applied to the hardware.

In order to overcome such a problem, the addition circuit of FIGS. 6A and 6B comprises the respective latches 33, 35 and 37 between the output of the analog-to-digital converter 32 and the input of the adder 34, between the output of the adder 34 and the input of the memory 36 and between the output of the memory 36 and the input of the adder 34 such that the processing can relatively simply be realized at higher speed. In such a circuit, each of the analog-to-digital conversion, read/write and addition operations may be carried out within 100 nanoseconds. Apparently, the operational speed is reduced by one-third that of the prior art so that the design of hardware can be facilitated.

The time series operation of the adding circuit will be described in detail referring to Tables 1 and 2.

Each of these tables represents operational cycles in columns transversely arranged one adjacent to another and flows of data for the respective devices in lines vertically arranged one above another. Table 1 shows the addition in the Y direction (block Y in FIG. 6A) while Table 2 shows the addition in the X direction (block X in FIG. 6B).

TABLE 1

| Device | | Cycle | | | | |
|---|---|---|---|---|---|---|
| | | T1 | | T2 | | T3 |
| | | t11 | t12 | t21 | t22 | t31 | t32 |
| A/D Converter | 32 | DATA(Pl, i) (A) | | DATA(Pl, i+1) | | DATA(Pl, 1+2) |
| Latch | 33 | DATA(Pl, 1−1) | | →DATA(Pl, i) | | DATA(Pl, i+1) |
| Adder | 34 | DATA(Pl, i−1) + Sl-1, i−1 | | (C) DATA(Pl, i) + Sl-1, i=Sl, i | | DATA(Pl, i+1) + Sl-1, i+1=Sl, i+1 |

TABLE 1-continued

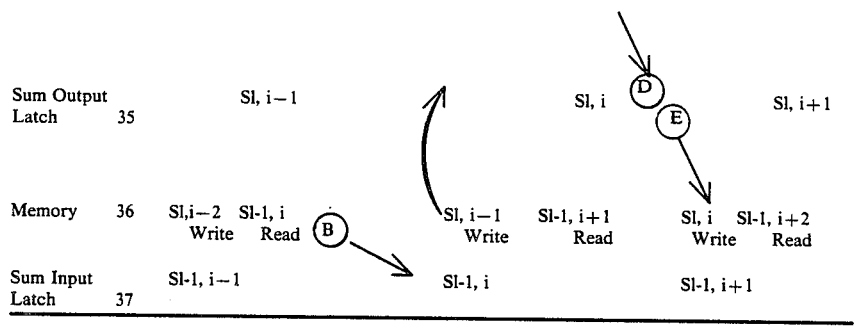

| | | | | | | | |
|---|---|---|---|---|---|---|---|
| Sum Output Latch 35 | | Sl, i−1 | | | Sl, i | | Sl, i+1 |
| Memory 36 | Sl,i−2 Write | Sl-1, i Read | | Sl, i−1 Write | Sl-1, i+1 Read | Sl, i Write | Sl-1, i+2 Read |
| Sum Input Latch 37 | Sl-1, i−1 | | | Sl-1, i | | Sl-1, i+1 | |

Referring first to Table 1, the adding operation consists of three basic cycles T1, T2 and T3 each of which may be of 100 nanoseconds as described hereinbefore. For convenience of operation, each of the cycles T1, T2 and T3 is divided into two subcycles t11, t12; t21, t22; t31, t32 each of which is of 50 nanoseconds.

Now suppose that data of the density of a picture element Pli located on the intersection of a scan line l ($0 \leq l \leq M$) with a column i ($0 \leq i \leq N$) (see FIG. 7) is DATA(Pl, i). The data DATA(Pl, i) digitized by the analog-to-digital converter 32 in the clock cycle T1, is then stored in the latch 33 during the next clock cycle T2 to provide one input data in the addition as shown by Ⓐ in Table 1.

In the sub-cycle t12, the content (Sl−1, i) of the memory of i in number is read and then stored in the sum input latch 37 during the cycle T2 as shown by Ⓑ in Table 1. This data (Sl−1, i) are one which are obtained by adding data from the first column to the column (l−1) in the line of i in number and which can be represented as follows:

Sl−1, i=DATA(P1, i)+DATA(P2, i)+...
DATA(Pl−1, i).

In other words, the data (Sl−1, i) is the sum of data in the column i until a scan line immediately before that scan line which provides the other input data of the adder 34. In the cycle T2, the adder 34 executes the addition of these two data DATA(Pl, 1) and (Sl−1, i) as shown by Ⓒ in Table 1. The resulting data is outputted as an established data from the adder 34 in the sub-cycle t21 and then latched by the sum output latch 35 in the sub-cycle t22 as shown by D in Table 1. This data is represented by:

(Sl, i)=DATA(Pl, i)+(Sl−1, i).

Next, in the forward sub-cycle t31 of the cycle T3, the data (Sl, i) is again stored in the memory of i in number as shown by Ⓔ in Table 1. This stored data (Sl, i) is held until a picture element of i in number on the next scan line (l+1) and again is added to the data of the picture element (Pl+1, i). In this manner, the memory of i in number will obtain the following addition data upon termination of the scanning of the line M:

SYi=DATA(P1, i)+DATA(P2, i) ... PYi(PM, i).

As described above, each of the analog-to-digital conversion, addition and read/write operation of the memory is carried out within one cycle of 100 nanoseconds. One process of these operations requires three cycles, this is, 300 nanoseconds in the conventional method. In accordance with the present invention, however, the operations are carried out in parallel. If the cyclic operation is sufficiently extended, a process becomes equal to one cycle of 100 nanoseconds.

In addition, noting the operation relative to the memory in Table 1, the cyclic operation is carried out as represented by read in the memory of i in number—write in the memory of (i−1) in number—read in the memory (i+1)—write in the memory i . . . . As shown in FIGS. 6A and 6B, therefore, two addressing circuits such as memory address circuits 50 and 51 are provided such that the address selector 52 is changed from one position to the other in accordance with read/write signals for addressing.

TABLE 2

| Device | Cycle | | |
|---|---|---|---|
| | T1 | T2 | T3 |
| A/D Converter 32 | DATA(Pl, i) Ⓐ | DATA(Pl, i+1) | DATA(Pl, i+2) |
| Latch 33 | DATA(Pl, i−1) | DATA(PL, i) | DATA(Pl, i+1) |
| Adder 38 | DATA(Pl, i−1) +Sl, i−2=Sl, i−1 | DATA Ⓔ (Pl, i) +Sl, i−1=Sl, i | DATA(Pl, i+1) +Sl, i=Sl, i+1 |
| Latch 39 Memory 40 | Sl, i−2 | Sl, Ⓔ i−1 | Ⓕ Sl, i |

Referring next to Table 2, the addition in the X direction will be described wherein the data DATA(P1, i) of the picture element (P1, i) converted by the analog-todigital converter 32 in the cycle T1 is stored in the latch 33 in the cycle T2 as in the step A of Table 1.

On the other hand, the latch 39 stores an addition data from the first picture element to the picture element (i−1) on the scan line l, represented by:

(Sl, i−1)=DATA(Pl, 1)+DATA(Pl, 2)+... +DATA(Pl, i−1).

In the cycle T2, this data (Sl, i−1) is added to another data DATA(Pl, i) by the adder 38 as shown by E in Table 2. This result (Sl, i) is latched by the latch 39 in the next clock cycle T3 as shown by F in Table 2 to provide one input of the addition in the clock cycle T3.

In such a manner, the addition of input data in the direction X is successively made within one scan line. Upon completion of this scanning operation, the following addition data are obtained:

(SX, l)=DATA(Pl, 1)+DATA(Pl, 2)+... +DATA(Pl, N).

Therefore, after one scan line has been terminated in the adding operation and when the next line is being scanned in the horizontal return stroke, the data (SX, l) may be stored in the memory 1 within the X-direction integrating memory 40.

By repeating the above-mentioned procedure from the beginning to the end of a frame, data in both the X and Y directions will be integrated.

Figure 8:
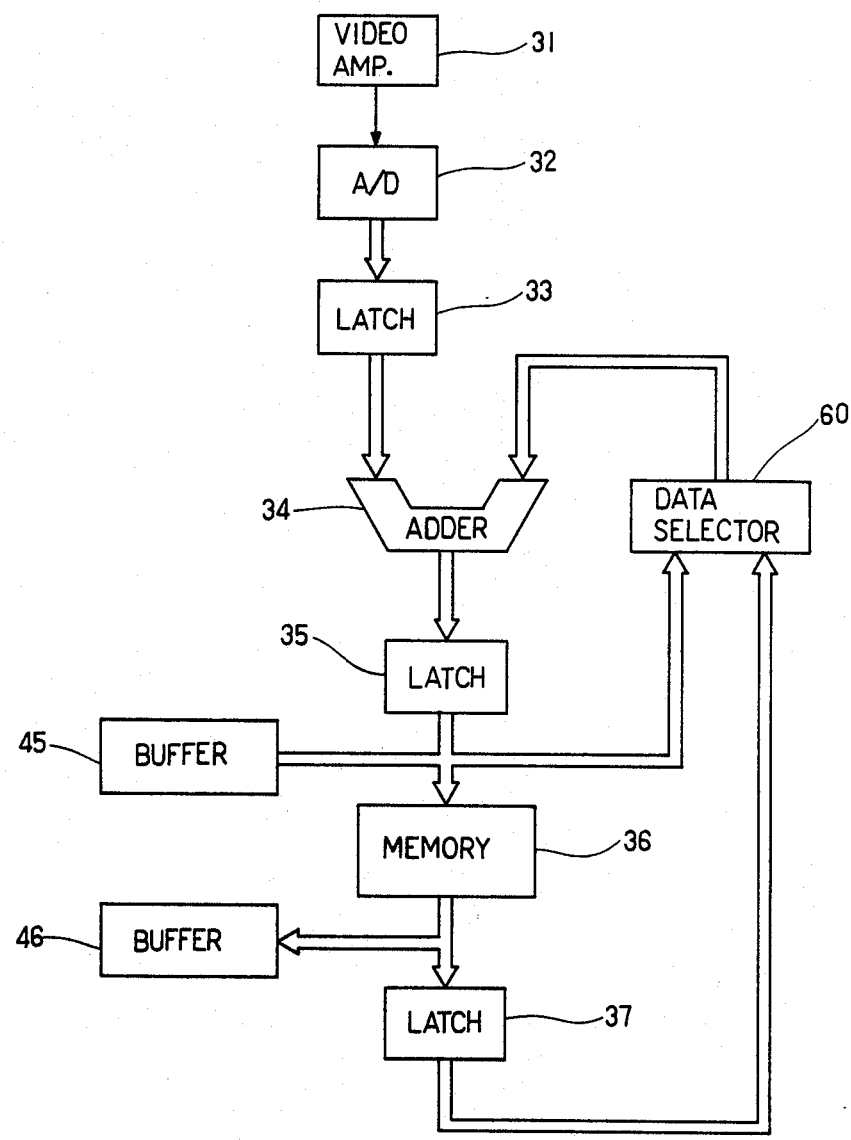
FIG. 8 is an electric block diagram showing another example of TV pre-alignment detection circuits.

FIG. 8 shows another embodiment of the present invention in which such blocks X and Y for the additions in the X and Y directions as shown in FIGS. 6A and 6B are combined into a single block of hardware.

In FIG. 8, numerals 31–37, 45 and 46 denote the same parts as are denoted by the same numerals in FIGS. 6A and 6B. A data selector 60 is provided which selects one of the outputs from the sum output and input latches 35 and 37 to transfer it to one of the inputs of the adder 34. The data selector 60 is actuated under the control of a sequence and memory control circuit as shown by 41 in FIG. 6A. In other words, the output of the sum output latch 35 is chosen upon addition in the X direction while the output of the sum input latch 37 is selected upon addition in the Y direction. In FIG. 8, the other circuits shown in FIGS. 6A and 6B, for example, the clock circuit 49, TV synchronizing signal generating circuit 56 and others are omitted in the interest of clarity. However, the embodiment of FIG. 8 does not require the block X and associated parts 38, 39, 40, 42, 47, 48, 54 and 55 shown in FIGS. 6A and 6B.

Figure 9:
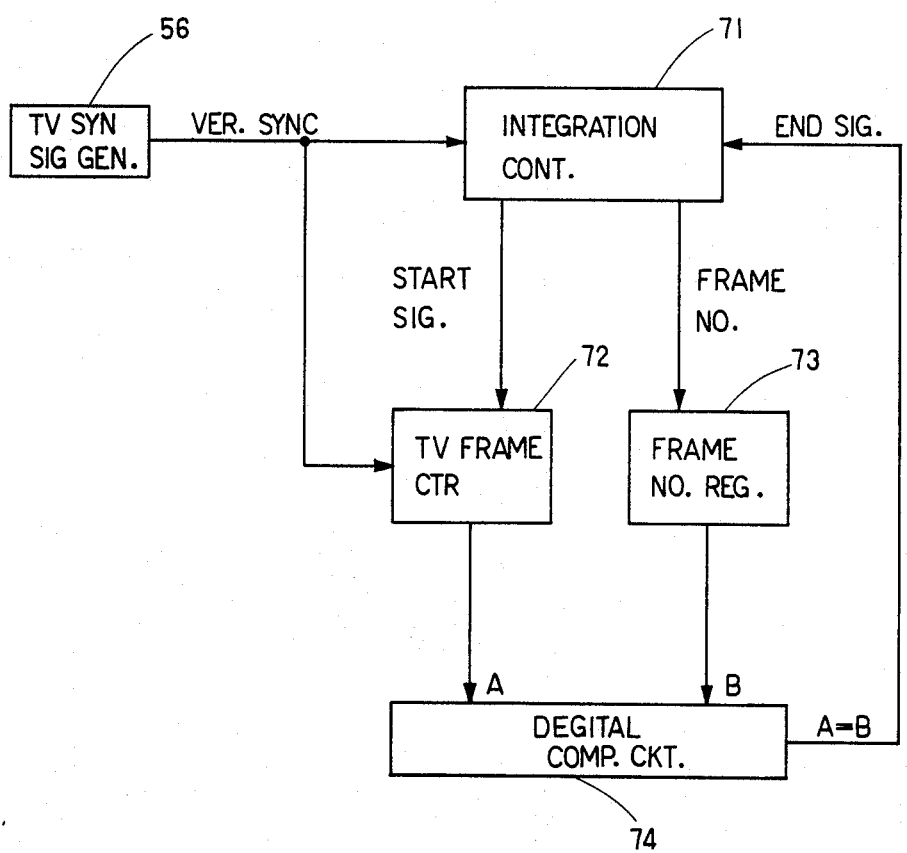
FIG. 9 is an electric block diagram of a circuit for selecting the number of integrations for a TV frame.

As seen from FIG. 9, the functions thereof is substantially similar to that of the embodiment shown in FIGS. 6A and 6B except its flow of operation in which the integrations in the X and Y directions are made in series and in time series rather than simultaneously. The output of the sum output latch 35 is first selected by the data selector 60 to execute the integration in the direction. Subsequently, the output of the sum input latch 37 is selected to execute the integration in the Y direction. These integrations may be inverted in order. If a single memory is used for both the integrations in the X and Y directions, the integration in the Y direction may be initiated after the position in the X direction has been measured by the microcomputer or after the contents of the memory 36 has been transferred to any other memory through the data bus.

The circuit of FIG. 8 requires a time period of measurement longer than that of FIGS. 6A and 6B, but provides simplified hardware to reduce the load during control.

The embodiment of FIG. 8 may be used to effect an integration per frame throughout a plurality of frames and yet is provided with means for selecting any number of integrated frames.

FIG. 9 is a block diagram showing an example of circuits for selecting the number of integrated frames. The illustrated circuit is located within a sequence and memory control circuit as shown by 41 in FIGS. 6A and 6B.

In FIG. 9, numeral 71 denotes an integration control circuit for controlling the number of integrations, the start of integration, the finish of integration and other functions; 72 is a TV frame counter circuit for counting vertical TV synchronizing signals; 73 is a frame number indicating register; 74 is a digital comparator for comparing the output of the TV frame counter circuit 72 with the output of the frame number indicating register 73.

Referring to FIG. 9, if an integration start signal is supplied to the integration control circuit 71 from a microprocessor (not shown) or the like, it is synchronized with a vertical TV synchronizing signal from the TV synchronizing signal generating circuit (56 in FIG. 6A) to provide a count start signal to the TV frame counter circuit 72. Upon receiving this count start signal, the TV frame counter circuit 72 begins to count the number of vertical synchronizing signals to count the number of frames.

On the other hand, the number of integrated frames are supplied to the frame number indicating register 73 via the integration control circuit 71 directly from the microprocessor or indirectly through the microprocessor under the instruction of an operator using a key board. If the TV frame counter circuit 72 has counted this instructed number of integrations, the digital comparator 74 supplies the integration control circuit 71 with a finish signal so that that integration will be terminated.

The selection of the number of integrations is advantageous in that:

(1) The number of integrations can be changed in accordance with the density in the picture and the S/N ratio so that any alignment mark can more possitively be detected.

(2) The number of integrations can be selected in accordance with the required accuracy of TV pre-alignment and the required speed so that the position of the pre-alignment mark will be detected with the desired accuracy at the required speed, and so on.

Since any carry may produce in the resulting addition if the number of integrations is increased, the gain of video input signals is adapted to be controlled by the video amplifier 31. In addition, each of the adders 34 and 38 is provided with means for sensing the occurrence of that carry and informing it to the sequence and memory control circuit 41.

The present invention is not limited to any specific method for detecting the position of the alignment mark in accordance with the data of integration. For example, the peak in a pattern may be detected. Alternatively, the leading and trailing edges of a pattern may be detected. Each of these detections may be made by a microcomputer in a software manner after termination of the integration.

The coordinate with respect to the position of the alignment mark is measured by the use of a TV pre-alignment reference mark on a plate glass as shown by 18 in FIG. 2.

As aforementioned, the embodiment of FIG. 9 is so constructed that the position of the reference mark is first read in the light field and then the alignment mark is read in the dark field. The reading of the reference mark in the light field is completely the same as that of the alignment mark in the dark field except that supposing that data has larger values if video signals are light, the integration data of the alignment mark has a value larger than that of the background while the integration data of the reference mark is a value smaller than that of the background. This is however essential since, for example, the data of the reference mark can simply be designed to be larger than that of the background by any software or hardware.

Such a design that the visual field for observation is changed in accordance with the kind of marks is advantageous in that each of the reference and alignment marks can be observed in a visual field in which it is less influenced by the background, to obtain video signals of higher S/N ratio.

Each of the light and dark field stops shown by 13A and 13B in FIG. 2 may electrically exchanged one for another by the use of any suitable exchanging means such as a plunger or the like. The position of the alignment mark measured in accordance with the position of the reference mark is indicated on the monitoring TV 9 (FIG. 1) as described hereinbefore.

This indicating operation will be described in detail with reference to FIG. 6. A coordinate of the position detected by the microcomputer is supplied to the X- and Y-position indicating registers 57 and 58 through the data bus. The outputs of these registers 57 and 58 are supplied as positional data to the marker indicating circuit 59 wherein the outputs of the position indicating registers are compared with the TV scanned position. If these signals are compatible with each other, a mixed signal is formed and supplied to the TV camera control section (22 in FIG. 5). The TV scanned position can be represented by the number of picture element as shown in FIG. 7, 1 to N in the X direction and 1 to M in the Y direction. These positional counts are addressed by the memories 36 and 40. Therefore, in the X direction, the address of the integration memory 36 in the Y direction is compared with the output of the X-position indicating register 57. In the Y direction, the address of the integration memory 40 in the direction X is compared with the output of the Y-position indicating register 58. If the address of that memory is compatible with the output of that register, a mixed signal is generated.

This mixed signal is further mixed with video signals obtained from the TV head 21 in the TV camera control section 22 and then indicated on the monitor TV 8.

The indicated mark is not limited to a specific cross mark but may be of a small square pattern. Further, the mark may be flashed to draw the operator's attention.

The fact that the detected position is indicated over a picture picked up by the TV camera is advantageous in that an operator can confirm the result of the TV pre-alignment on the monitor TV.

Although the X and Y coordinates of the pre-alignment mark can be detected with high accuracy as mentioned above, it may be also required to detect the inclination $\theta$ of the mark in the X and Y planes.

In such a case, there may be thought of two methods: the first method for detecting the inclination $\theta$ by the use of a single mark and the second method for detecting the inclination $\theta$ by the use of two marks in the visual field. The first method is carried out in accordance with a peak value, peak width or inclination in the integration data of the mark. In the first method, however, any accurate detection cannot be expected since it is delicately influenced by the reflection or scatter on an object to be detected and since the calculation of the inclination $\theta$ is very difficult. The second method also has a problem in that the visual field must be widened to always catch two marks therein so that the detections of the inclination $\theta$, X-position and Y-position are reduced in accuracy.

In accordance with the present invention, the above problems can be overcome and the inclination $\theta$ can be detected with higher accuracy.

The present invention provides two marks on an object to be detected at positions spaced away from each other by a predetermined distance (for example, in the direction X). In the first measurement, one of the above marks is placed within the visual field of the TV and then detected with reference to its X- and Y-positions in such a manner as described hereinbefore. Subsequently, the wafer stage (5 in FIG. 1) is moved in the X direction by a predetermined distance XT. Thereafter, the other mark is placed within the visual field of the TV and then detected with respect to its X- and Y-positions in the same manner.

Supposing that the position of the first mark is represented by X1 and Y1, the position of the second mark is indicated by X2 and Y2 and the distance of movement in the wafer stage is equal to XT, the inclination $\theta$ is given by:

$$\theta = \tan^{-1}\left(\frac{XT + X2 - X1}{Y2 - Y1}\right).$$

If the distance of movement XT is sufficiently increased, the inclination $\theta$ can be determined with higher accuracy.

The just mentioned method is convenient in that the inclination $\theta$ can be detected with higher accuracy simply by moving the wafer stage.

Depending on the required accuracy in the detected position, it may not be required to detect the inclination $\theta$. In such a case, the first mark is only detected to know its X- and Y-positions and then to execute the TTL automatic detection of alignment mark.

The selection of both the first and second marks or only the first mark may be judged by the microcomputer depending on the required accuracy or others or instructed by the operator by the use of a key board or the like. Briefly, by selecting two-point measurement in which the position can be detected with higher accuracy for an extended period of time or one-point measurement in which the detection can more rapidly be accomplished with lower accuracy, the detection can more effectively be carried out.

In accordance with the present invention, such a state that is suitable for fine alignment can be produced by the TV pre-alignment. As a result, very accurate alignment can be realized for a reduced time period as a whole. Further, the visual field in the detection system for fine alignment can be increased in dimension so that the design thereof can extremely be facilitated with the performance being improved.

In accordance with the present invention, furthermore, the two dimensional scanning type detection system is adopted for TV pre-alignment which permits the accuracy thereof to reduce in comparison with the fine alignment. Therefore, the pre-alignment marks may be of a relatively simple configuration. Further, the scanning operation may be carried out by the use of the image pick-up tube or solid state image pick-up element so that the components such as the optical systems or the like will be simplified leading to the reduction of cost.

What is claimed is:

1. A wafer position detecting apparatus, comprising:
    projection optical means for exposing a wafer to a circuit pattern of a mask;
    first illuminating means, disposed adjacent said projection optical means, for illuminating the wafer without using said projection optical means;
    first photoelectric conversion means, associated with said first illuminating means, for detecting a mark on the wafer;
    second illuminating means for illuminating the wafer through said projection optical means;
    second photoelectric conversion means, associated with said second illuminating means, for detecting a mark on the wafer;
    wafer carrying means movable between a first position where a wafer carried thereon is illuminated by said first illuminating means and a second position where the wafer carried thereon is illuminated by said second illuminating means; and
    control means including:
        detecting means for detecting the deviation of the mark on the wafer carried by said carrying means from a predetermined reference position by cooperation with said first illuminating means and said first photoelectric conversion means without aligning the mark on the wafer with the predetermined reference position; and
        means for moving said carrying means to the second position in accordance with an output from said detecting means indicative of the detected deviation to allow the wafer to be illuminated and detected by said second illuminating means and said second photoelectric conversion means.

2. An apparatus according to claim 1, wherein said first photoelectric conversion means includes a group of two-dimensionally arranged photoreceptor elements, and said first illuminating means includes a light source for the two-dimensional photoreceptor elements.

3. An apparatus according to claim 1, wherein said second photoelectric conversion means includes a spot-like photoreceptor, and said second illuminating means includes a laser source for the spot-like photoreceptor.

4. An apparatus according to claim 1, wherein said first photoelectric conversion means has a detectable area larger than that of said second photoreceptor conversion area.

5. An apparatus according to claim 1, wherein said first photoelectric conversion means detects the position of the wafer using an alignment mark, and said second photoelectric conversion means detects the position of the wafer using a different alignment mark.

6. An apparatus according to claim 1, further comprising dark field detecting means, light field detecting means and switching means for selectively using said dark field detecting means and said light field detecting means.

* * * * *

UNITED STATES PATENT AND TRADEMARK OFFICE
CERTIFICATE OF CORRECTION

PATENT NO. : 4,794,648

DATED : December 27, 1988

INVENTOR(S) : NAOKI AYATA ET AL.        Page 1 of 4

It is certified that error appears in the above-identified patent and that said Letters Patent is hereby corrected as shown below:

ON THE TITLE PAGE,
AT [56] REFERENCES CITED

U.S. Patent Documents, "4,521,082 6/1985 Suzoki et al."
        should read --4,521,082 6/1985 Suzuki et al.--.

SHEET 10 OF 10

Figure 9, No. 74, "DEGITAL   " should read --DIGITAL   --.
                    COMP.CKT.                    COMP.CKT.

COLUMN 3

Line 16, "mask 1a in" should read --mask 1 in a--.
    line 21, "in plane" should read --in a plane--.

COLUMN 4

Line 11, "condensor lens 12" should read
         --condenser lens 12--.
    Line 19, "and" should read --and are--.
    Line 26, "relay line 16;" should read --relay lens 16;--.
    Line 68, "protrusion" should read --protrusions--.

COLUMN 5

Line 10, "S/N ratio" should read --an S/N ratio--.
    Line 35, "junctions prism" should read --junction prism--.

COLUMN 6

Line 7, "example as shown," should read
        --example, as shown--.

UNITED STATES PATENT AND TRADEMARK OFFICE
CERTIFICATE OF CORRECTION

PATENT NO. : 4,794,648
DATED : December 27, 1988
INVENTOR(S) : NAOKI AYATA ET AL.   Page 2 of 4

It is certified that error appears in the above-identified patent and that said Letters Patent is hereby corrected as shown below:

COLUMN 7

Line 57, "image date" should read --image data--.
Line 65, "a" (first occurrence) should read --an--.

COLUMN 8

Line 1, "to-digial" should read --to-digital--.
Line 12, "a" should read --an--.
Line 17, "adders 33, 38," should read --adders 34, 38,--.
Line 28, "memories 36 and 37" should read
          --memories 36 and 40--.

COLUMN 9

Line 48, "the direction" should read --the X direction--.

COLUMN 10

Line 10, "scanning the" should read --scanning of the--.
Line 11, "of" should be deleted.
Table 1, "Latch 33 DATA(P1, 1-1)" should read
          --Latch 33 DATA(P1, i-1)--.

COLUMN 11

Line 66, "D" should read --Ⓓ--.

UNITED STATES PATENT AND TRADEMARK OFFICE
CERTIFICATE OF CORRECTION

PATENT NO. : 4,794,648

DATED : December 27, 1988

INVENTOR(S) : NAOKI AYATA ET AL.                    Page 3 of 4

It is certified that error appears in the above-identified patent and that said Letters Patent is hereby corrected as shown below:

COLUMN 13

Line 2,  "step A" should read --step (A)--.
    Line 10, "E" should read --(E)--.
    Line 12, "F" should read --(F)--.
    Line 15, "direction X" should read --X direction--.
    Line 57, "the direc-" should read --the X direc- --.

COLUMN 14

Line 46, "possitively" should read --positively--.

COLUMN 15

Line 26, "may" should read --may be--.
    Line 50, "direction X" should read --X direction--.

UNITED STATES PATENT AND TRADEMARK OFFICE
CERTIFICATE OF CORRECTION

PATENT NO. : 4,794,648
DATED : December 27, 1988
INVENTOR(S) : NAOKI AYATA ET AL.

It is certified that error appears in the above-identified patent and that said Letters Patent is hereby corrected as shown below:

COLUMN 16

Line 22, "direction X)." should read --X direction).--.

Signed and Sealed this

Twelfth Day of June, 1990

Attest:

HARRY F. MANBECK, JR.

Attesting Officer      Commissioner of Patents and Trademarks